United States Patent [19]
Han

[11] Patent Number: 5,464,712
[45] Date of Patent: Nov. 7, 1995

[54] METHOD FOR FABRICATING A PHASE SHIFTING MASK

[75] Inventor: O. Suk Han, Songpa-ku, Rep. of Korea

[73] Assignee: Goldstar Electron Co., Ltd., Rep. of Korea

[21] Appl. No.: 233,069

[22] Filed: Apr. 26, 1994

[30] Foreign Application Priority Data

Jun. 15, 1993 [KR] Rep. of Korea .................. 10867/1993

[51] Int. Cl.$^6$ ........................................... G03F 9/00
[52] U.S. Cl. ............................ 430/5; 430/322; 430/324; 430/325; 430/326; 430/328; 430/330
[58] Field of Search ............................... 430/5, 322, 324, 430/325, 326, 328, 330

[56] References Cited

U.S. PATENT DOCUMENTS 4,968,583 11/1990 Ohshio et al. ......................... 430/296
5,229,255 7/1993 White ....................................... 430/5

OTHER PUBLICATIONS

Article entitled "Specifying Phase Shift Mask Image Quality Parameters" by P. D. Buck and M. L. Rieger, published in the SPIE vol. 1604 11th Annual BACUS Symposium on Photomask Technology (1991).

Primary Examiner—S. Rosasco
Attorney, Agent, or Firm—Poms, Smith, Lande & Rose

[57] ABSTRACT

A method for fabricating a phase shifting mask suitable for positive photoresist process. The method includes the steps of: (a) forming a plurality of opaque layer patterns (44) in an array at a fixed interval from each other in their width direction on a substrate (41); (b) coating an interlayer (45) on and covering the opaque layer patterns; (c) forming interlayer patterns (45) on the substrate at both longitudinal sides of each opaque layer pattern by etching the interlayer; (d) forming a plurality of insulation films (46) on the substrate between adjacent pairs of the opaque layer patterns on which the interlayer patterns are formed; (e) removing the remaining interlayer under each of the insulation films; and (f) forming a phase shifter (47) having a ninety degree area (47-2) in a region where the interlayer has been removed and a one hundred and eighty degree area (47-1) in the remainder of the region by heating the insulation film.

45 Claims, 23 Drawing Sheets

FIG.1 prior art
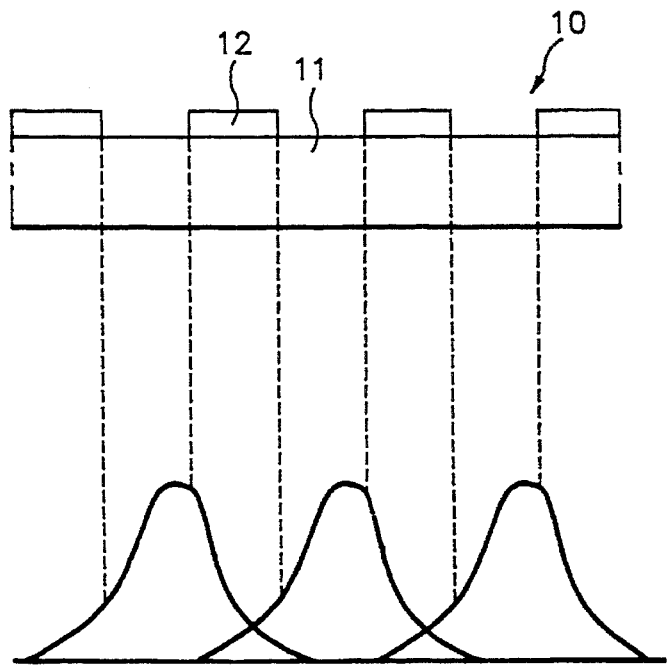
FIG.2a prior art
FIG.2b prior art
FIG.2c prior art

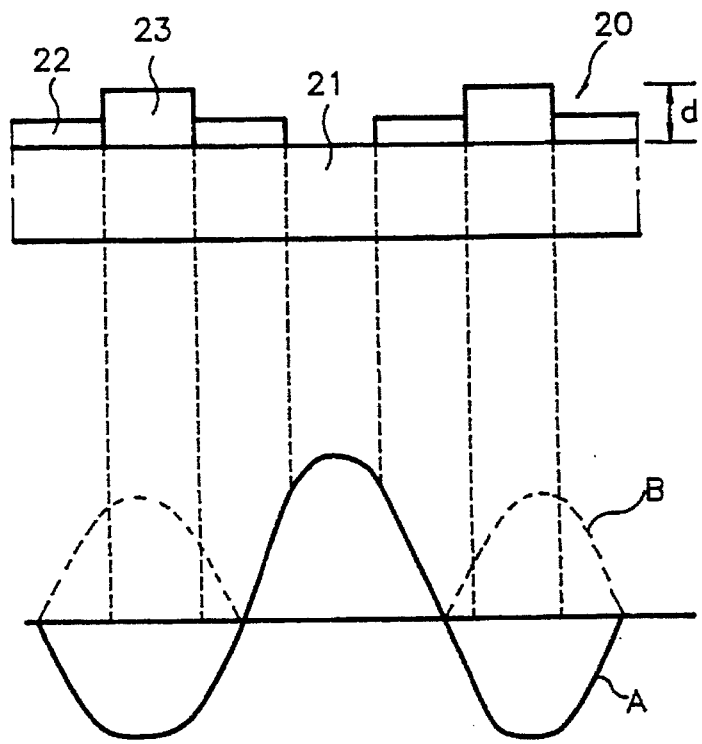
FIG. 3 prior art
FIG. 4a prior art
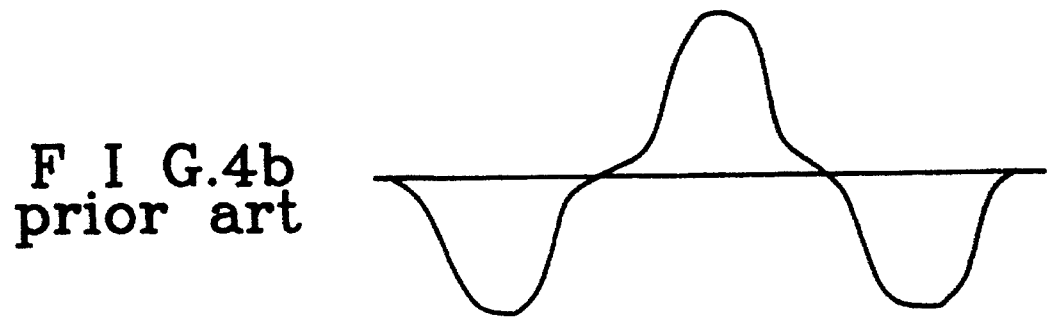
FIG. 4b prior art
FIG. 4c prior art

METHOD FOR FABRICATING A PHASE SHIFTING MASK

FIELD OF THE INVENTION

This invention relates to a method for fabricating a phase shifting mask, more particularly to a method for fabricating a phase shifting mask suitable for positive photo resist process.

BACKGROUND OF THE INVENTION

Shown in FIG. 1 is a common mask 10 for patterning, and shown in FIG. 2(a) is amplitude of light on the mask 10, FIG. 2(b) is amplitude of light on a wafer and FIG. 2(c) is intensity of light on the wafer.

Referring to FIG. 1, a common patterning mask 10 includes structure having opaque layers 12 of chrome spaced from each other in a certain interval formed on a transparent substrate 11 of quartz.

As shown in FIG. 2(a), the amplitude of light on the mask 10 overlaps offsetting each other on both edges of the opaque layer 12, and the amplitude, and the intensity of light on the wafer behaves as shown in FIGS. 2(b) and 2(c), respectively.

Therefore, in case the mask 10 is used, it is impossible to obtain a clear patterning due to smaller difference of intensity of light, exhibiting unclear shade, at both edges of the opaque layer 12.

Moreover, because the rate of offset of light on both edges of the opaque layer is greater in a microscopic patterning, a microscopic patterning process can not be carried out with the foregoing mask 10.

Recently, as all elements are highly integrated, requirements on masks for carrying out super microscopic patterning in the order of submicron has risen.

To meet such a requirements, the phase shifting masks have been developed.

Shown in FIG. 3 is a section of a conventional phase shifting mask, and shown in FIG. 4 is wave of light of the phase shifting mask of FIG. 3.

Referring to FIG. 3, a common phase shifting mask 20 includes a structure having opaque layers 22 of chrome spaced from each other in a certain interval formed on a transparent substrate 21 of quartz, between which opaque layers 22 phase shifters 23 are formed.

These phase shifters 23 serve to shift the phase of amplitude of light incident to the substrate.

Shown in FIG. 4(a) is amplitude of light on the phase shifting mask 20 of FIG. 3.

In FIG. 4(a), curve A indicates amplitude of light incident to the substrate 21 when there is no phase shifting mask 23, and curve B indicates amplitude of light incident to the substrate 21 when there is the phase shifter 23.

According to FIG. 4(a), it can be shown that the phase of the amplitude of light incident to the substrate 21 has been shifted 180 degrees by the phase shifter 23.

In FIG. 4(a), the phase difference δ between the graph A and the graph B can be represented in following formula (1).

$$\begin{aligned} \delta &= knd - kn0d \\ &= k(n-n0)d \\ &= \frac{2\pi}{\lambda}(n-1)d \end{aligned} \quad (1)$$

where, n is the refraction index of the phase shifter 23, d is the thickness of the phase shifter 3, and n0 is the refraction index of air.

In formula(1), it can be known that the phase difference should be 180 degrees ie., π for shifting the phase of an amplitude of light completely.

When the phase difference δ is substituted by π in formula(1), the thickness of the phase shifter 23 for shifting the phase completely can be represented in following formula.

$$d = \frac{\lambda}{2(n-1)} \quad (2)$$

A phase shifting mask 20 having conventional phase shifter 23 includes the phase shifter 23 formed between two adjacent opaque layers 22, which phase shifter 23 shifts the phase of incident light onto a substrate 21 180 degrees as shown in FIG. 4(a).

Accordingly, though the phase shifting mask 20 is used, overlap of light at both edges of the opaque layers 23 does not occur, which makes light having an amplitude as shown in FIG. 4(b) incident onto a wafer.

Therefore, using the foregoing phase shifting mask 20 is advantageous for super microscopic patterning due to the great difference of intensity of light at both edges of the opaque layers 23 providing clear shade of light incident onto a wafer.

There are spatial frequency modulation type, edge emphasis type and cut-off effect emphasis type in kinds of phase shifting masks.

Of the foregoing phase shifting masks, a spatial frequency modulation type phase shifting mask has, as known well, disadvantage of carrying out removing unnecessary bridge pattern film formed at the edges of the phase shifter at the time of fabrication.

Recently, as a solution for this problem, a process for fabricating a phase shifter which can shift the phase at the edges of a phase shifter by 90 degrees instead of shifting 180 degrees, is under development.

In a phase shifting mask having a 180 degrees area for shifting the phase at a main area of the phase shifter by 180 degrees, and a 90 degrees area for shifting the phase at edges of the phase shifter by 180 degrees, the phase shifter has to have different thicknesses in the 180 degrees area and the 90 degrees area from each other in order for a phase shifter, shifting phase 180 degrees, to shift the phase 90 degrees only at the edges thereof.

As for the method for fabricating a phase shifting mask having 180 degrees area and 90 degrees area, there is a method for fabricating a phase shifter having different thicknesses in 90 degrees area and 180 degrees area from each other through two times of deposition processes and two times of patterning processes.

The foregoing method is described in detail in SPIE Vol. 1604, 11th Annual BACUS symposium on Photomask Technology, 1991, pp 265 to 273.

However, such a method is cumbersome due to two times of deposition processes in forming the phase shifter and two times of photo etching processes in forming the 90 degrees area and the 180 degrees area.

As an another method, there is a method for fabricating a phase shifting mask having 90 degrees area at the edges of the 180 degrees area by forming 90 degrees area through etching of the edges of the 180 degrees area after a phase shifter of 180 degrees area having been formed.

Referring to FIG. 5, the foregoing Levenson type phase shifting mask is to be explained in detail.

FIGS. 5(a) to 5(c) show a structure of a conventional Levenson type phase shifting mask, of which FIG. 5(a) shows a plan view of the phase shifting mask, FIG. 5(b) shows a section across line A—A' of FIG. 5(a), and FIG. 5(c) shows a section across line B—B' of FIG. 5(c).

Referring FIGS. 5(a) to 5(c), a conventional Levenson type phase shifting mask 30 is provided with a structure having a plurality of chrome patterns 34 formed spaced from each other on a quartz substrate 31 as opaque layers and a plurality of phase shifters 37 formed between and partially overlapped with adjacent two chrome patterns 34 on the substrate 31.

Each phase shifter 37 has 180 degrees area 37-1 and 90 degrees area 37-2, wherein the part corresponding to the opaque layer pattern 34 is 180 degrees area 37-1, and the portion corresponding to the edge parts of the opaque layer pattern 34 is 90 degrees area 37-2.

Referring to FIGS. 6 and 7, a method for fabricating a conventional Levenson type phase shifting mask having a structure as shown in FIG. 5 is to be explained hereinafter.

FIGS. 5(a) to 6(m) and 7(a) to 7(m) show a method for fabricating a conventional Levenson type phase shifting mask, of which, FIGS. 6(a) to 6(m) are sections across line A—A' of FIG. 5(a) showing the fabrication method, and FIGS. 7(a) to 7(m) are sections across line B—B' of FIG. 5(a) showing the fabrication method.

First, as shown in FIGS. 6(a) and 7(a), a chrome layer 32 is formed on a quartz substrate 31, and a negative photoresist film 33 is coated thereon.

Through exposure (FIGS. 6(b) and 7(b)) and development (FIGS. 6(c) and 7(c)), the negative photoresist film 33 is patterned with a predetermined pattern.

Then, the chrome layers are etched using the patterned negative photoresist film 33 (FIGS. 6(d) and 7(d)), and the remained photoresist film 33 is removed to form a plurality of opaque layer patterns 34 (FIGS. 6(e) and 7(e)).

The plurality of opaque layer patterns 34 are positioned in array with a certain interval from each other in the direction of the width thereof (direction of line A—A').

Next, an insulation film 35 is coated on all over the opaque layers 34 (FIGS. 6(f) and 7(f)), on which insulation film 35 a negative photoresist film 36 is coated (FIGS. 6(g) and 7(g)), which is subjected to patterning through exposure (FIGS. 6(h) and 7(h)) and development (FIGS. (7i) and 7(i)) using predetermined pattern.

The insulation film is etched using the patterned negative photoresist film 36 (FIGS. 6(j) and 7(j)), and the remained photoresist film 36 is removed forming a plurality of phase shifters 37 between and partially overlapped with two adjacent opaque layer patterns 34 (FIGS. 6(k) and 7(k)).

This phase shifter 37 is a 180 degrees phase shifter.

Then an etching process is carried out for etching the edges of the phase shifters 37 to a predetermined thickness so as to form the 90 degrees area shifting the phase 90 degrees at the edges of each phase shifters.

Again, a negative photoresist film 38 is coated on all over the surface, which is undertaken a patterning with predetermined pattern exposing both edges of the phase shifters 37 in the longitudinal direction(direction of line B—B' of FIG. 5(a) thereof (FIGS. 6(l) and 7(l)).

The exposed edge part of the phase shifter 37 is etched to a certain thickness using the patterned negative photoresist film 38.

Thus, fabrication of a conventional phase shifting mask is completed by forming phase shifters 37 which can shift the phase 90 degrees at both edges not overlapping with the opaque layer patterns 37 and shift the phase 180 degrees in rest of the part.

As such, the foregoing method for fabricating a conventional Levenson type phase shifting mask has a cumbersome process of carrying out photo etching process once more to form the 90 degrees area 37-2 which shifts the phase 90 degrees at edges of the phase shifters, and a problem of difficulty in controlling the process for etching the phase shifters of the edge part to shift the phase 90 degrees exactly.

SUMMARY OF THE INVENTION

The object of this invention designed to solve foregoing problems, is providing a method for fabricating a phase shifting mask suitable for photoresist process, with which quality phase shifters can be obtained.

These and other objects and features of this invention can be achieved by providing a method for fabricating a phase shifting mask including steps for forming a plurality of opaque layer patterns in array at a fixed interval from each other in the direction of width thereof on a substrate, coating an interlayer on all over the substrate to cover the plurality of the opaque layer patterns, forming interlayer patterns on the substrate at both sides in the longitudinal direction of each opaque layer by etching the interlayers, forming a plurality of insulation films on the substrate between adjacent one pair of the opaque layer patterns the interlayer patterns formed thereon, removing the remained interlayers under each of the insulation film, and forming a phase shifter having 90 degrees area in a part where the interlayer has been removed and 180 degrees area in rest of the part by making the insulation film cause to flow with heat treatment.

BRIEF DESCRIPTION OF THE DRAWINGS

FIG. 1 is a section of a conventional patterning mask.

FIGS. 2(a) to 2(c) show light wave patterns of the mask of FIG. 1, wherein FIG. 2(a) shows amplitude of light on the mask, FIG. 2(b) shows amplitude of light on a wafer, and FIG. 2(c) shows intensity of light on the wafer.

FIG. 3 is a section of a common phase shifting mask.

FIGS. 4(a) to 4(c) are wave pattern of light of the phase shifting mask of FIG. 3, wherein FIG. 4(a) shows amplitude of light on a phase shifting mask, FIG. 4(b) shows amplitude of light on a wafer, and FIG. 4(c) shows intensity of light on the wafer.

FIGS. 5(a) to 5(c) show a structure of a conventional Levenson type phase shifting mask, wherein FIG. 5(a) shows plan view, FIG. 5(b) shows a section across line A—A' of FIG. 5(a), and FIG. 5(c) shows a section across line B—B' of FIG. 5(b).

FIGS. 7(a) to 7(m) show a method for fabricating a phase shifting mask across line B—B' of FIG. 5(a).

FIGS. 8(a) to 8(c) show a structure of a phase shifting mask in accordance with a first embodiment of this invention, wherein FIG. 8(a) is a plan view, FIG. 8(b) is section across line C—C' of FIG. 8(a), and FIG. 8(c) is a section across line D—D' of FIG. 8(a).

FIGS. 11(a) to 11(c) show a structure of a phase shifting mask in accordance with a second embodiment of this invention, wherein FIG. 11(a) is a plan view, FIG. 11(b) is a section across line C—C' of FIG. 11(a), and FIG. 11(c) is a section across line D—D' of FIG. 11(a).

FIGS. 13(a) to 13(c) show a structure of a phase shifting mask in accordance with a third embodiment of this invention, wherein FIG. 13(a) is a plan view, FIG. 13(b) is a section across line C—C' of FIG. 13(a), and FIG. 13(c) is a section across line D—D' of FIG. 13(a).

DETAILED DESCRIPTION OF THE PREFERRED EMBODIMENTS

Figure 5A:
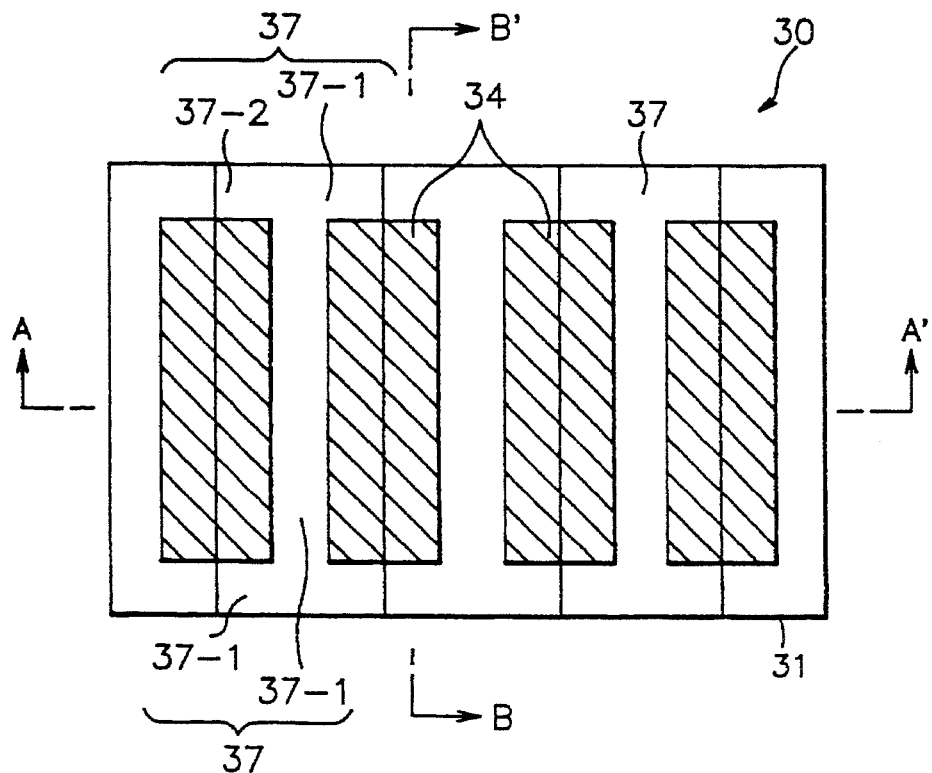
Figure 5B:
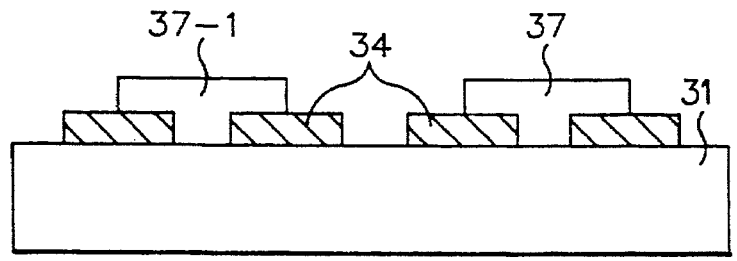
Figure 5C:
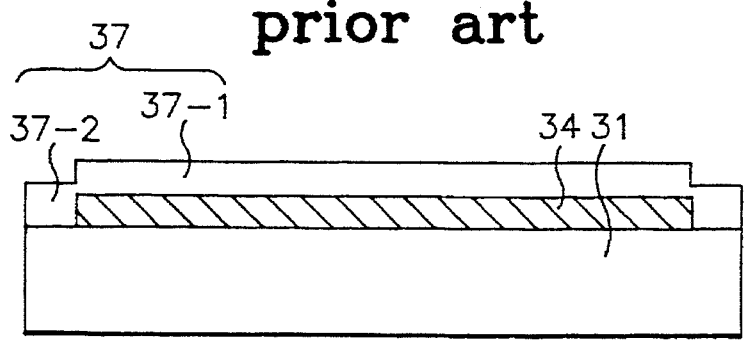
Figure 6A:
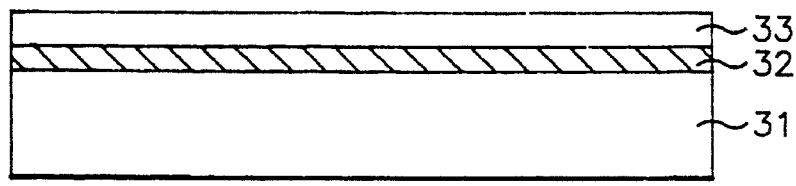
FIGS. 6(a) to 6(m) show a method for fabricating a phase shifting mask across line A—A' of FIG. 5(a).
Figure 6B:
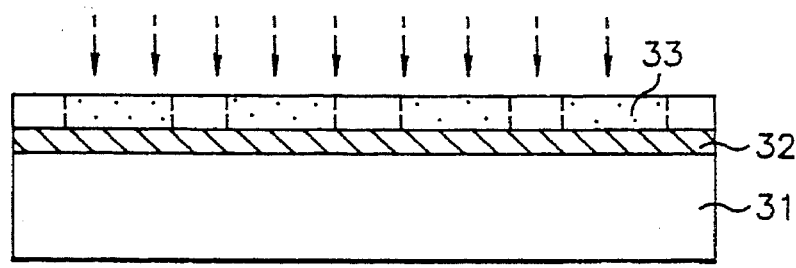
Figure 6C:
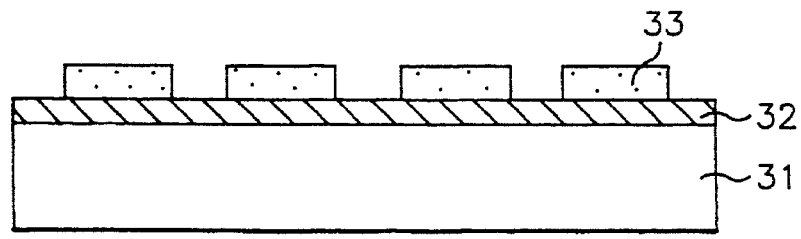
Figure 6D:
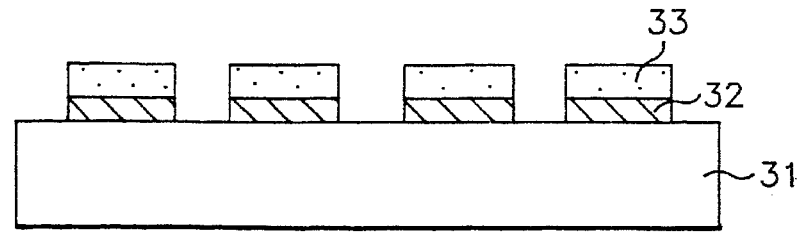
Figure 6E:
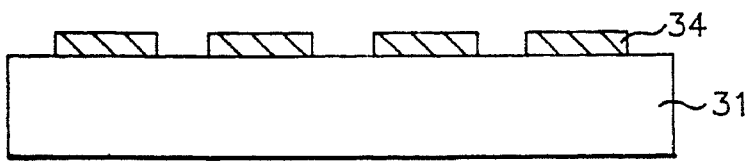
Figure 6F:
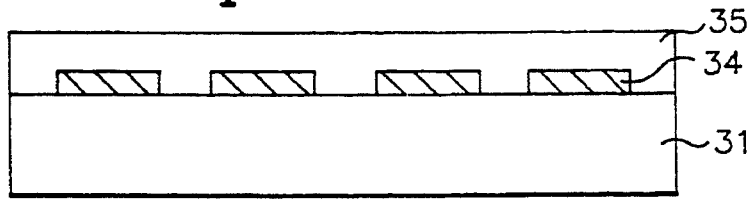
Figure 6G:
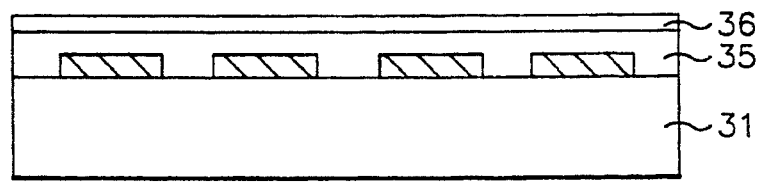
Figure 6H:
Figure 6H:
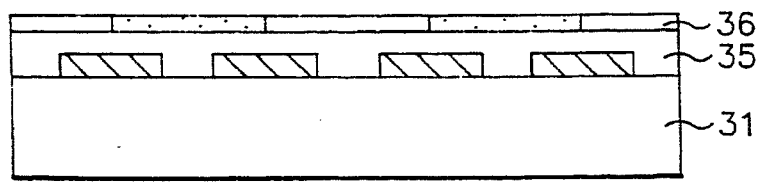
Figure 6I:
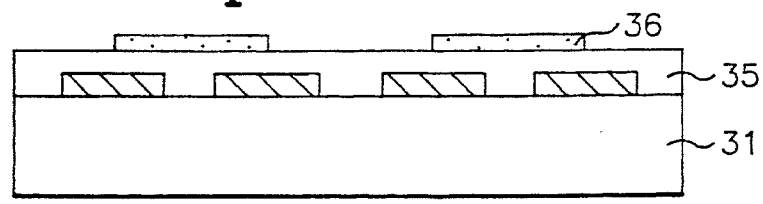
Figure 6J:
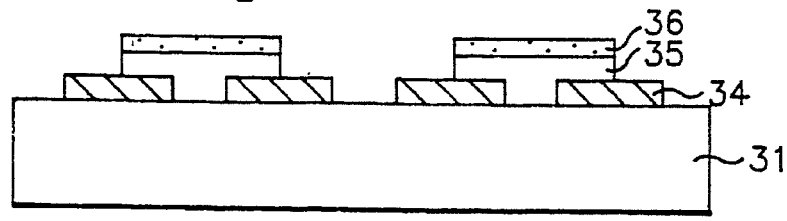
Figure 6K:
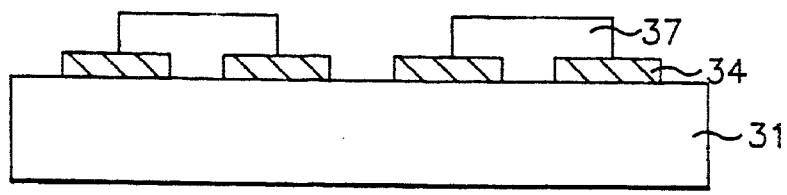
Figure 6L:
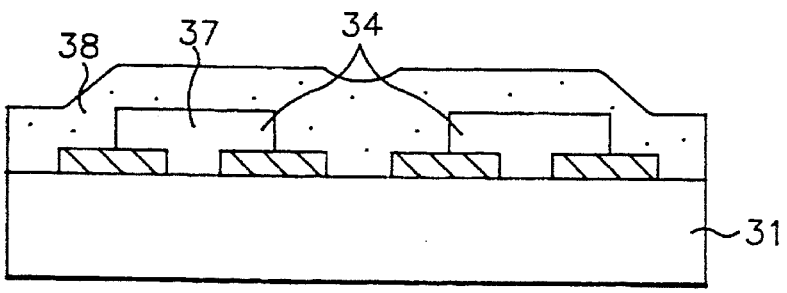
Figure 6M:
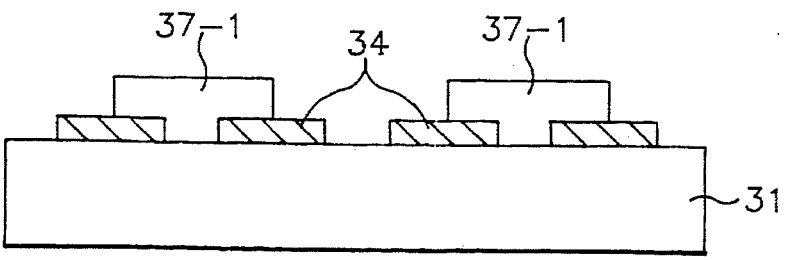
Figure 7A:
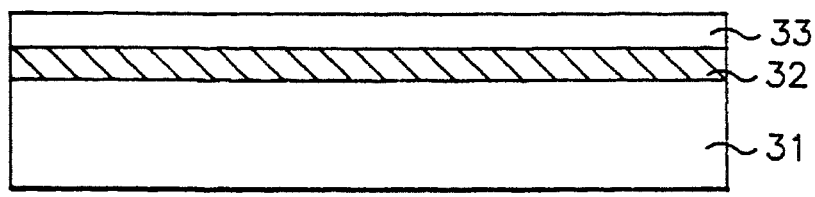
Figure 7B:
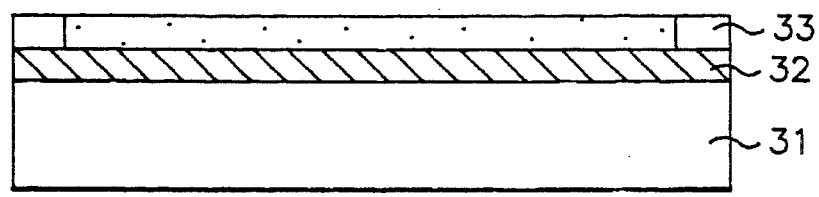
Figure 7C:
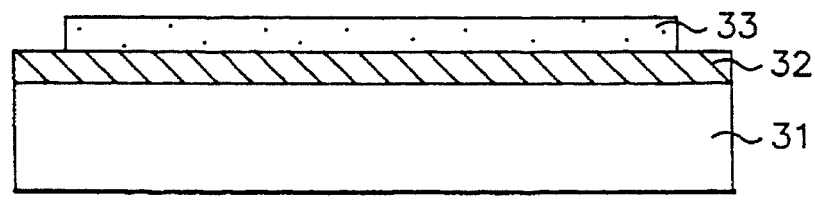
Figure 7D:
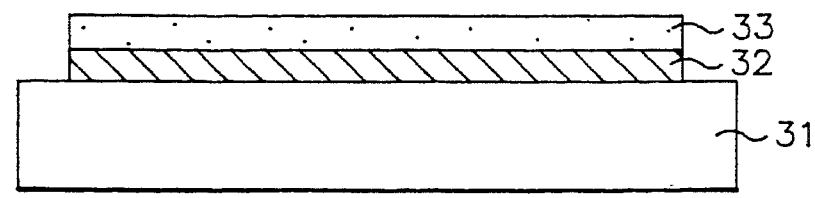
Figure 7E:
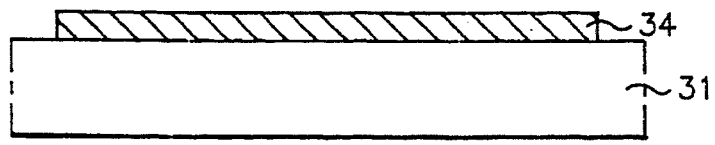
Figure 7G:
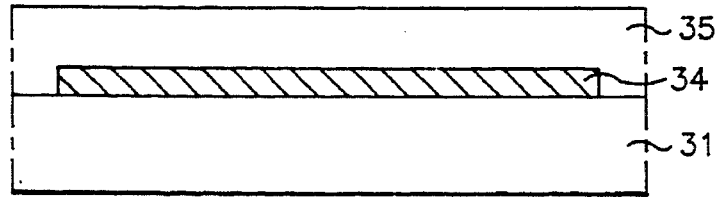
Figure 7G:
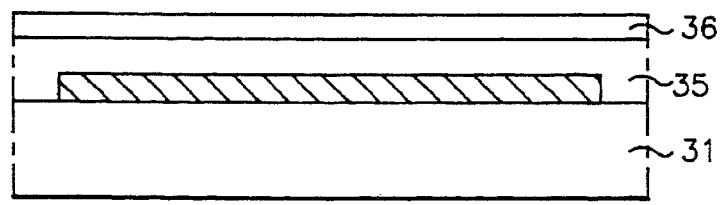
Figure 7H:
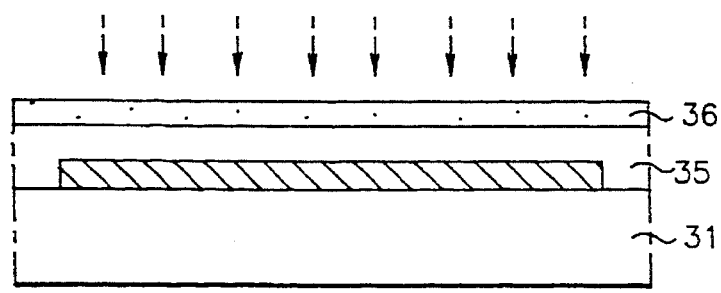
Figure 7I:
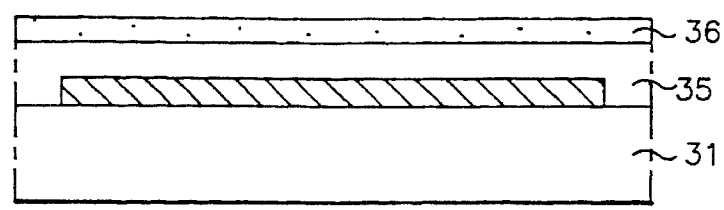
Figure 7J:
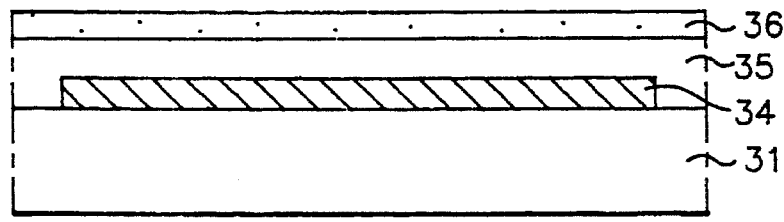
Figure 7K:
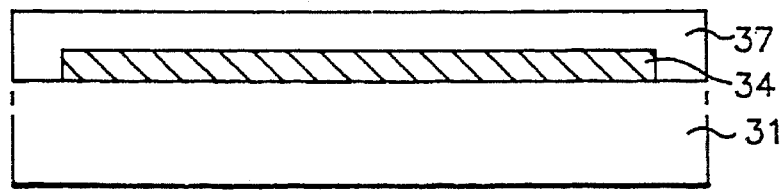
Figure 7L:
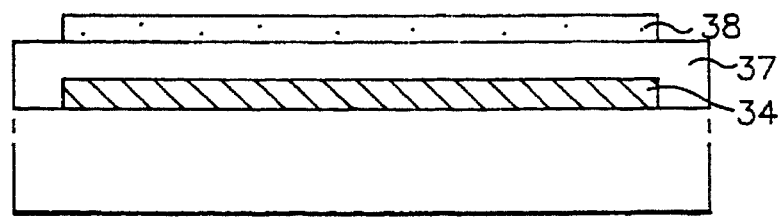
Figure 7M:
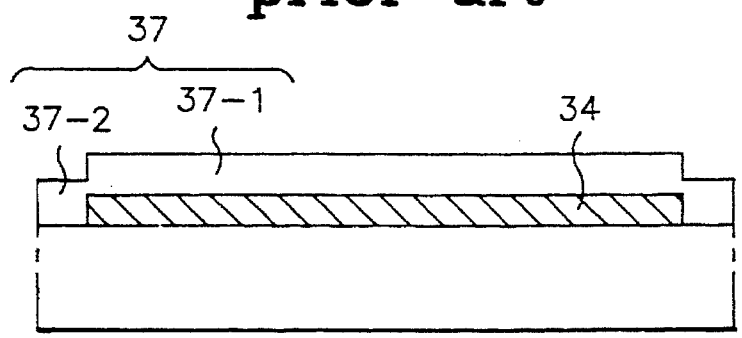
Figure 8A:
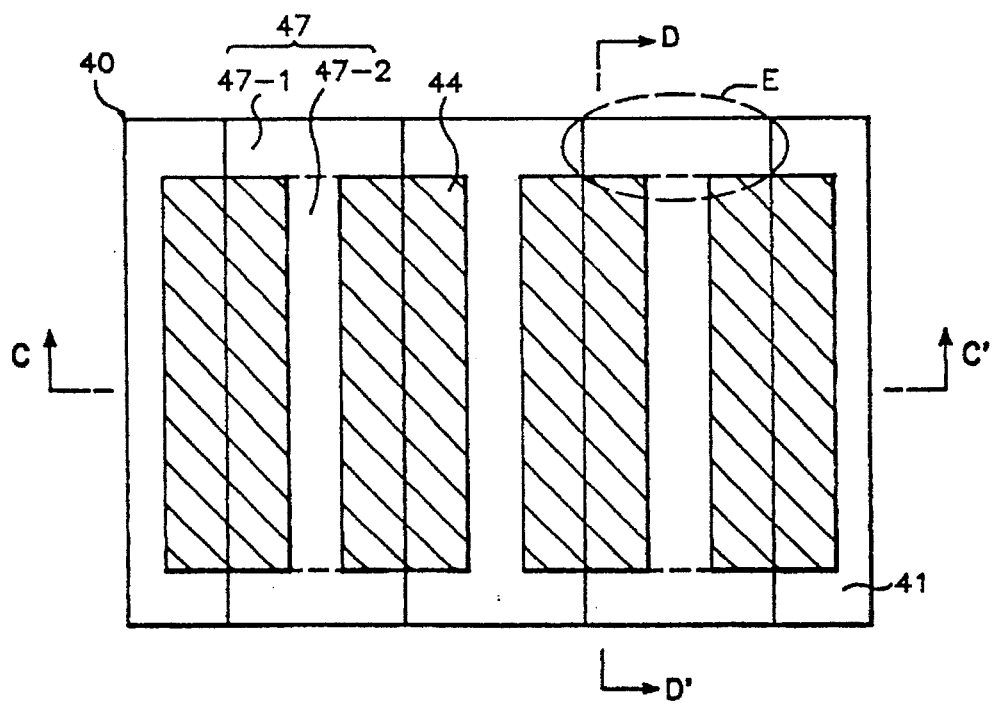
Figure 8B:
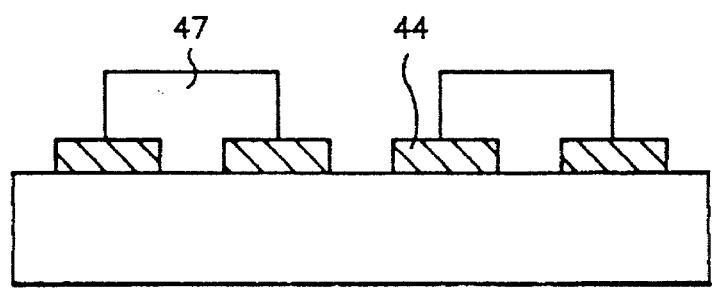
Figure 8C:
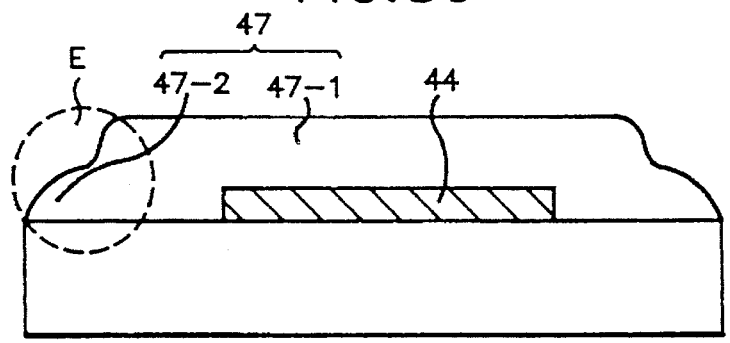

FIGS. 8(a) to 8(c) show a structure of a phase shifting mask in accordance with a first embodiment of this invention, wherein FIG. 8(a) is a plan view, FIG. 8(b) is a section across line C—C' of FIG. 8(a), and FIG. 8(c) is a section across line D—D' of FIG. 8(a).

FIGS. 9(a) to 9(i) show a process for fabricating a phase shifting mask across line C—C' of FIG. 8(a), and FIGS. 10(a) to 10(i) show a process for fabricating a phase shifting mask across line D—D' of FIG. 8(a).

Figure 9A:
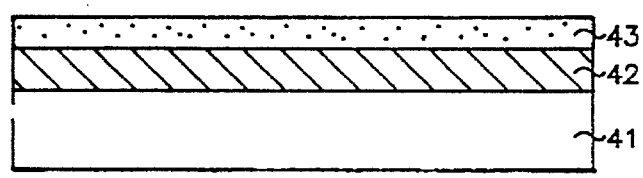
FIGS. 9(a) to 9(i) show a process for fabricating a phase shifting mask across line C—C' of FIG. 8(a).
Figure 9B:
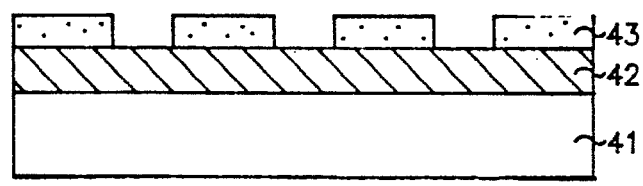
Figure 9C:
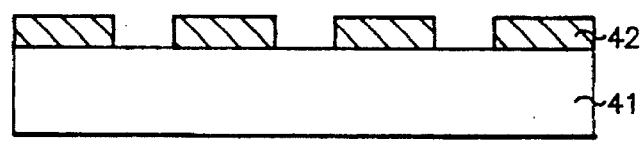
Figure 9D:
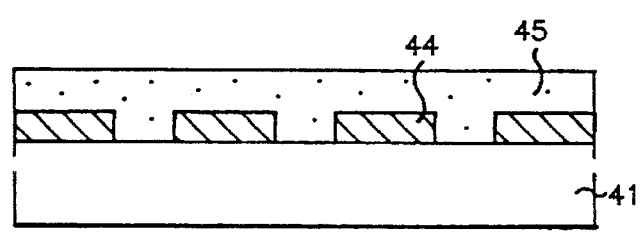
Figure 9E:
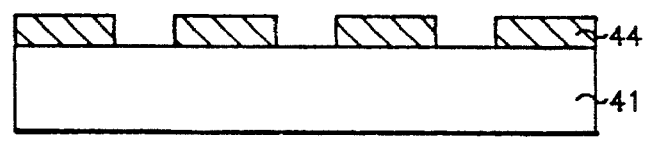
Figure 9F:
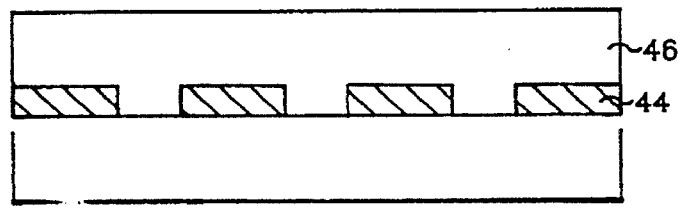
Figure 9G:
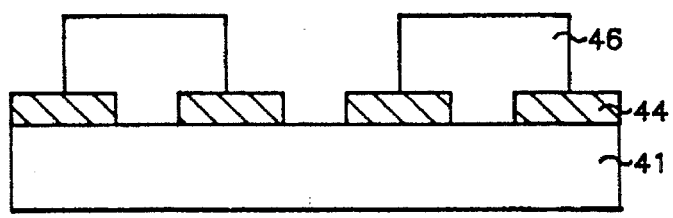
Figure 9H:
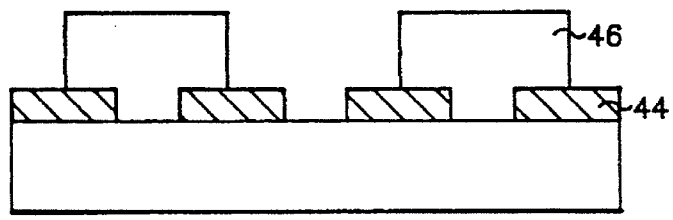
Figure 9I:
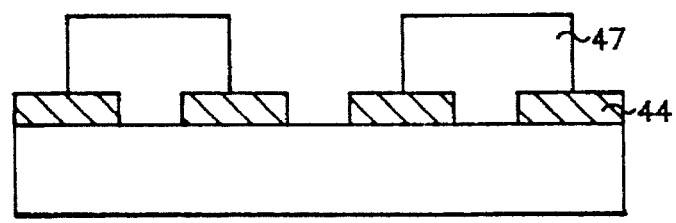
Figure 10A:
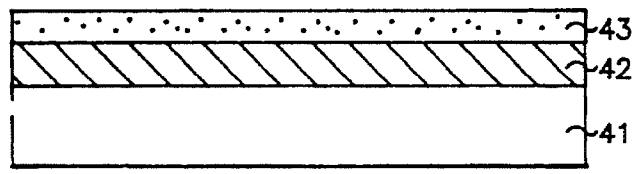
FIGS. 10(a) to 10(i) show a process for fabricating a phase shifting mask across line D—D' of FIG. 8(a).

First, referring to FIGS. 9(a) to 9(i) and 10(a) to 10(i), a glass substrate 41 is coated with a chrome layer 42, on which a resist film 43 for electron beam lithography is coated (FIGS. 9(a) and 10(a)).

Figure 10B:
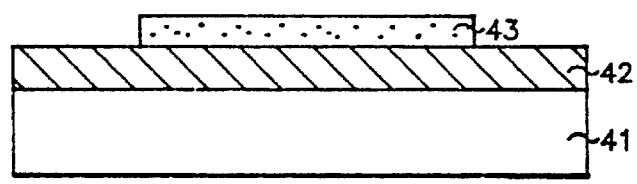
Figure 10C:
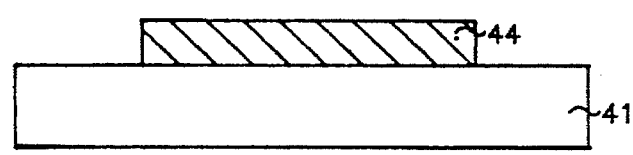

The resist film 43 is undertaken patterning to a desired pattern using an electron beam lithography system (FIGS. 9(b) and 10(b)), which resist film 43 pattern is used for etching the chrome layer, and the remained resist film 43 is removed to form a plurality of opaque layer patterns 44 (FIGS. 9(c) and 19(c)).

The plurality of the opaque layer patterns 44 is positioned in array with a fixed interval from each other.

Figure 10D:
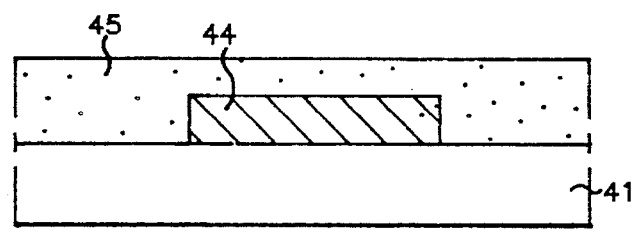
Figure 10E:
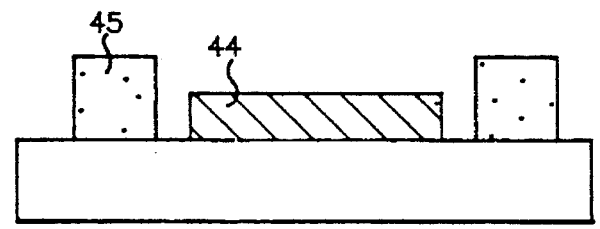

Then, an electron beam resist film 45 is coated again on all over the substrate to cover the opaque layers 44 completely (FIGS. 9(d) and 10(d)), which is subjected to a patterning to from a desired pattern using an electron beam lithography system (FIGS. 9(e) and 10(e)).

Figure 16A:
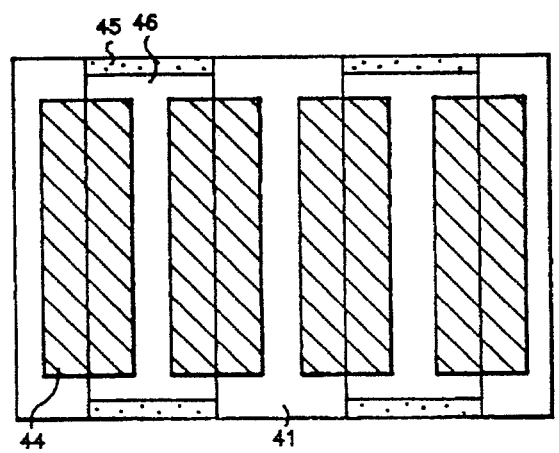
FIGS. 16(a) to 16(c) are plan views of patterns of electron resist film in accordance with the first to the third embodiments.

Referring to FIG. 16(a), the resist film 45 patterns are formed spaced with the opaque layer patterns 44 in a fixed interval.

Figure 10F:
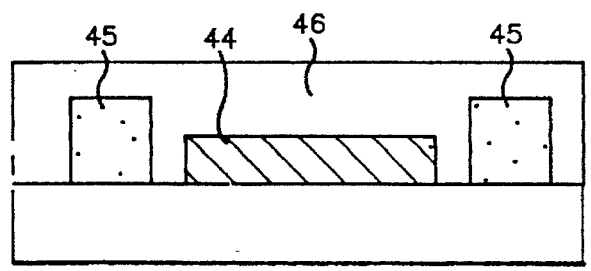

Then, a spin on glass film 46 is formed on all over the substrate to a thickness of $\lambda/2(n-1)$, a thickness capable to shift the phase 180 degrees (FIGS. 9(f) and 10(f)).

Figure 10G:
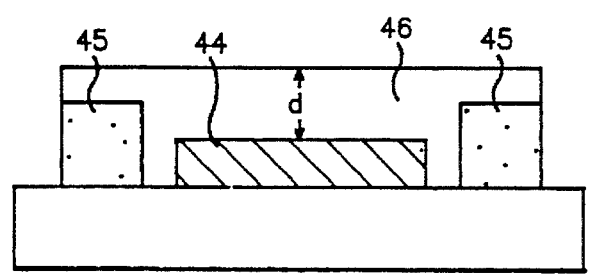

The SOG (Spin On Glass) film 46 is subjected to an etching to form a desired pattern (FIGS. 9(g) and 10(g)).

Figure 10H:
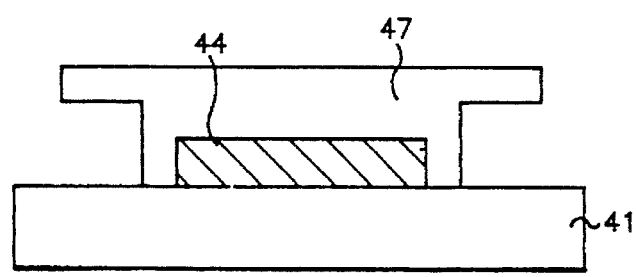

Next, the patterns of the electron beam resist film 45 formed beyond each of the opposing sides of each one pair of the opaque layer patterns 44 (FIGS. 9(h) and 10(h)) are removed, and, which is undertaken a heat treatment at a temperature about 200 to 400 degrees C.

Figure 10I:
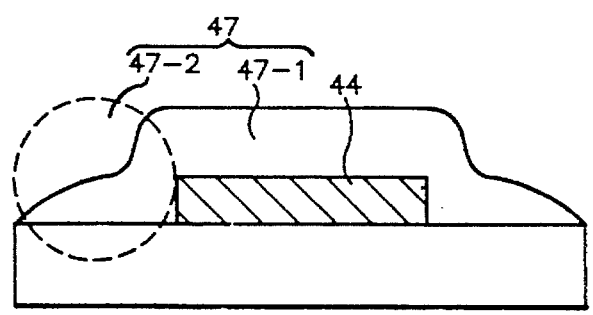

When the SOG film 46 is subjected to a heat treatment to cause flow, the SOG film 46 at the edge parts the electron-beam resist film 45 having been removed therefrom (FIG. 8(a) and E parts of FIG. 10(i)) become linear on the substrate 21, finally obtaining a phase shifter 47.

This phase shifter 47 has vertical sides in the longitudinal direction of each opaque layer pattern 44 (D—D' direction) as shown in FIGS. 8(b) and 9(i), and linear sides in the direction of width of each opaque layer pattern 44 (C—C' direction) as shown in FIGS. 8(a) and 10(i).

That is, in the first embodiment, the phase shifter has the 90 degrees area 47-1 formed only on both edges of the longitudinal direction (D—D') thereof.

Thus, a phase shifter 47 having 180 degrees area 47-1 and 90 degrees area 47-2 can be obtained by appropriately controlling the thickness of the electron beam resist film 45.

That is, where the refraction index is n, the thickness is d, and $\lambda$ is the wave length of transmission light of a phase shifter 47, the thickness of a phase shifter $d=\lambda k/2(n-1)$.

In this time, the thickness d of the phase shifter 47 is deposited so that the phase can be shifted 180 degrees in the main pattern areas corresponding to upper surfaces of adjacent one pair of opaque layer patterns 44.

On the other hand, since the phase has to be shifted 90 degrees at the edges of the phase shifter 47, the electron beam resist film 45 has to be coated to have a thickness of $\lambda/4(n-1)$, one half of the thickness of the phase shifter 47 because the 90 degrees areas 47-2 have to be formed on both sides of adjacent opaque layer patterns 44 by flow process after removing the resist film formed thereon as shown in FIGS. 10(f) to 10(h).

Figure 11A:
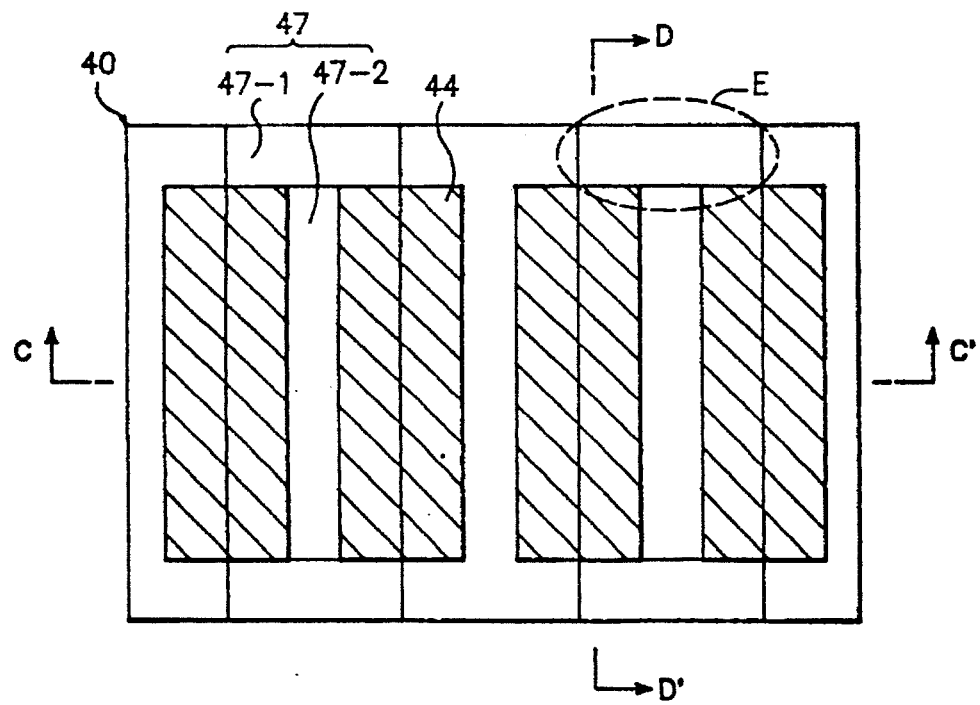
Figure 11B:
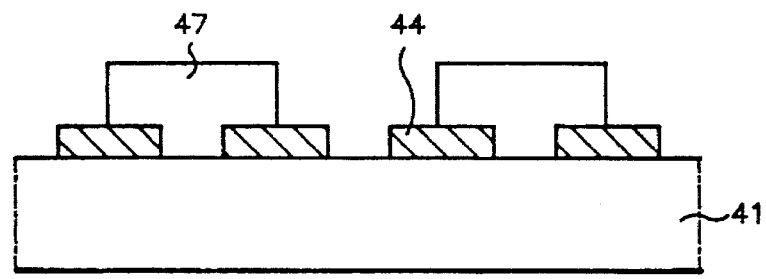
Figure 11C:
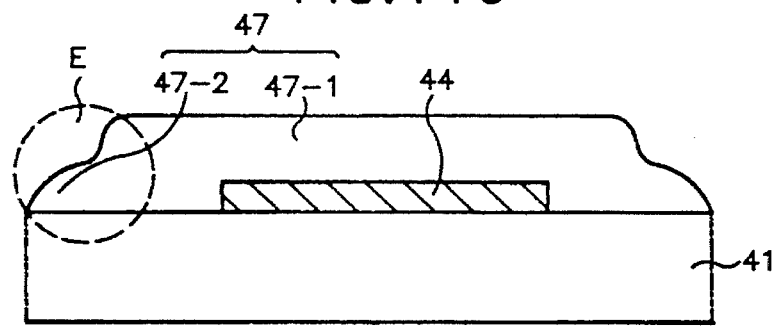

FIGS. 11(a) to 11(c) show a structure of a phase shifting masks in accordance with a second embodiment of this invention, and FIGS. 12(a) to 12(i) show a process for fabricating a phase shifting mask across line D—D' of FIG. 11(a).

In FIGS. 11(a) to 11(c) and 12(a) to 12(i), identical reference numbers are given to the identical or corresponding parts with FIGS. 8 to 10 for the first embodiment.

The method for fabricating a phase shifting mask in accordance with the second embodiment is identical to the method for fabricating a phase shifting mask in accordance with the first embodiment.

Figure 16B:
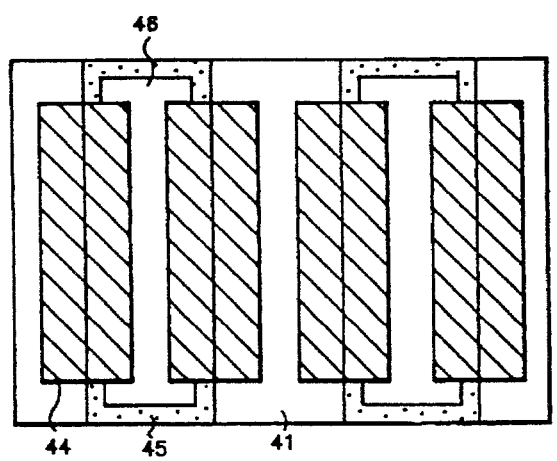

However, as shown in FIG. 16(a), though the pattern of the electron beam resist films 45 are formed at lower part of the edges of the phase shifter 47 spaced with the opaque layer pattern 44 in a fixed distance in first embodiment, as shown in FIG. 16(b), the pattern of the electron beam resist films 45 are formed on the lower part of the edges of the phase shifter 47 excluding the edges of the phase shifter 47 overlapped with the adjacent one pair of opaque layer patterns 44 in the second embodiment.

That is, the process for fabricating phase shifting mask across line C—C' of FIG. 11(a) is identical to the process in accordance with the first embodiment (FIGS. 9(a) to 9(i)), and the process for fabricating a phase shifting mask across line D—D' of FIG. 11(a) is as shown in FIGS. 12(a) to 12(i).

Referring to FIGS. 12(a) to 12(i), the process for fabricating a phase shifting mask in accordance with the second embodiment is the same with the process in accordance with the first embodiment, in which a plurality of opaque layer patterns 44 are formed on a substrate 41, on which an electron resist film 44 is coated (FIGS. 12(a) to 12(d)).

Figure 12A:
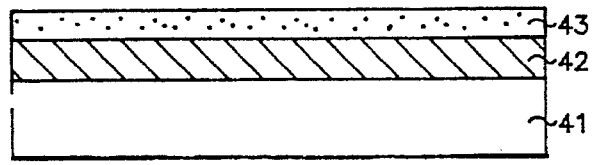
FIGS. 12(a) to 12(i) show a process for fabrication across line D—D' of FIG. 11(a).
Figure 12B:
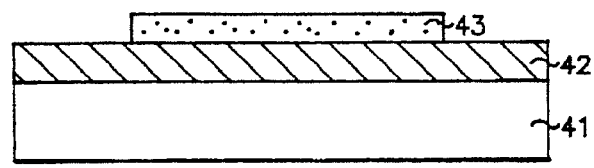
Figure 12C:
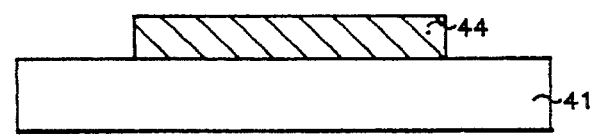
Figure 12D:
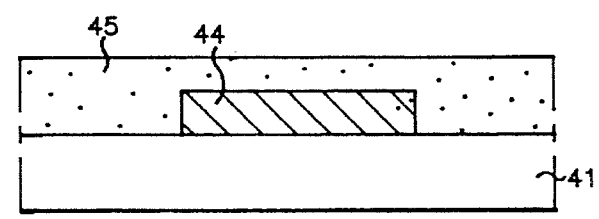
Figure 12E:
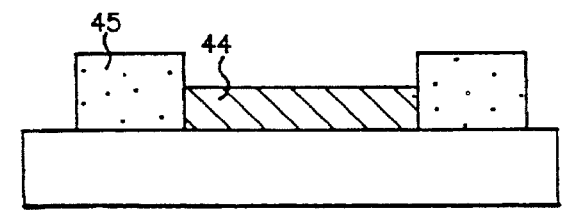

Then, the electron beam resist film 45 is etched using an electron beam lithography system so that the pattern of the electron beam resist film 45 can be formed on the substrate 41 contacting with both edges in the longitudinal direction of the opaque layer pattern 44 (FIG. 12(e)).

Figure 12F:
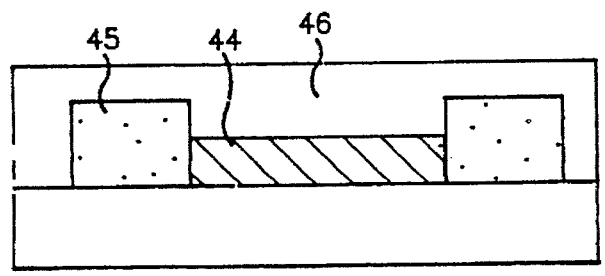
Figure 12G:
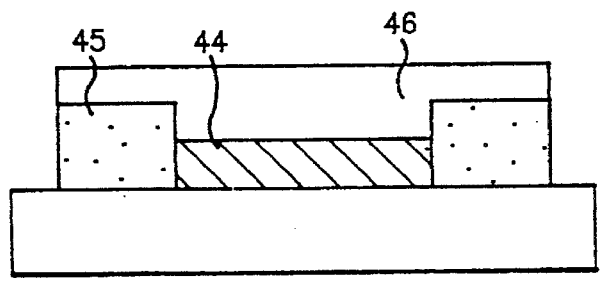

After carrying out patterning of the electron beam resist film 45, a SOG film 46 is coated on all over the substrate, which SOG film 46 is undertaken a patterning over and between one pair of adjacent opaque layer patterns 44 (FIGS. 12(f) and 12(g)).

Referring to FIG. 16(b), in the second embodiment, the electron beam resist film 45 is formed at lower part of the edges of the SOG film 46.

In this time, the electron beam resist film 45 does not exist at the lower part of edges of the SOG film formed on one pair of adjacent opaque layer patterns 44.

Figure 12H:
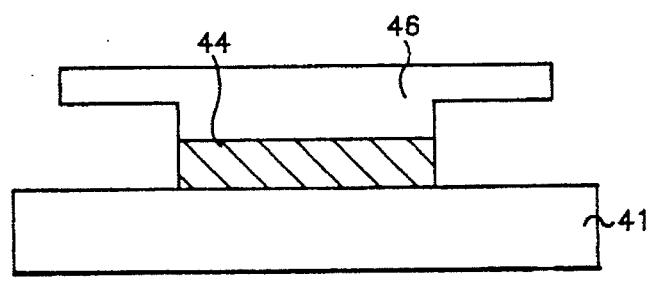
Figure 12I:
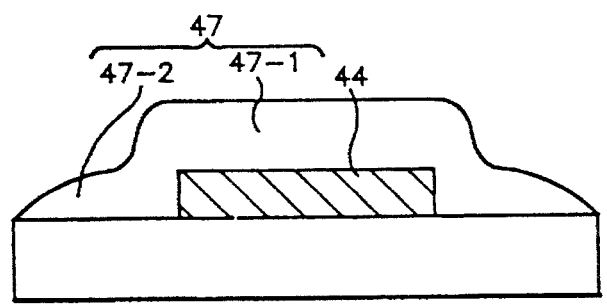

Then, the pattern of the electron beam resist film 45 is removed (FIG. 12(h)), the SOG film 46 is made to cause flow to form a phase shifter 47 (FIG. 12(i)).

The phase shifter 47 in accordance with the second embodiment has 90 degrees area 47-2 formed on all edges excluding the part overlapped with one pair of the adjacent opaque layer patterns 44.

Figure 13A:
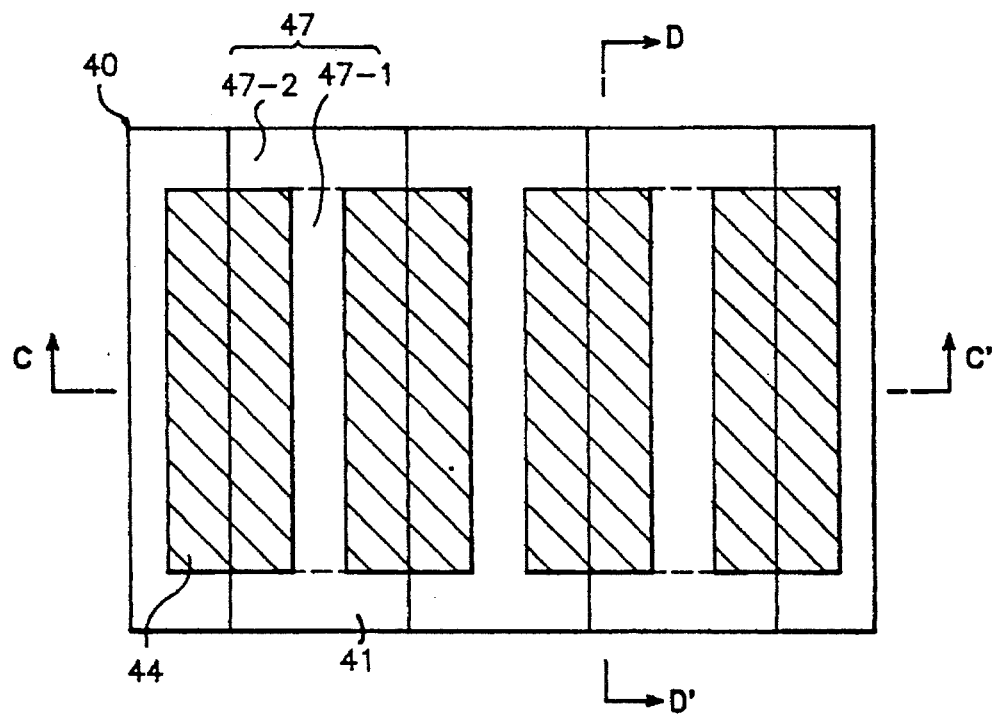
Figure 13B:
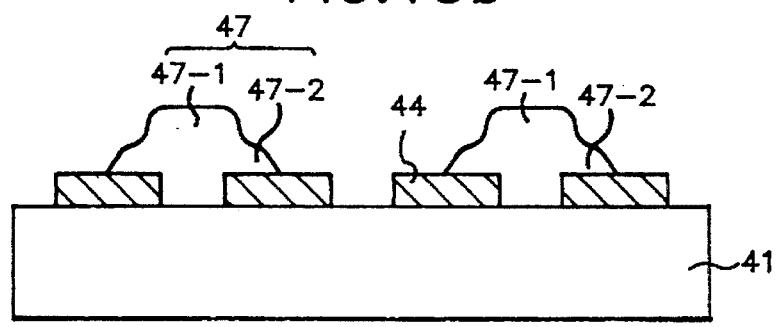
Figure 13C:
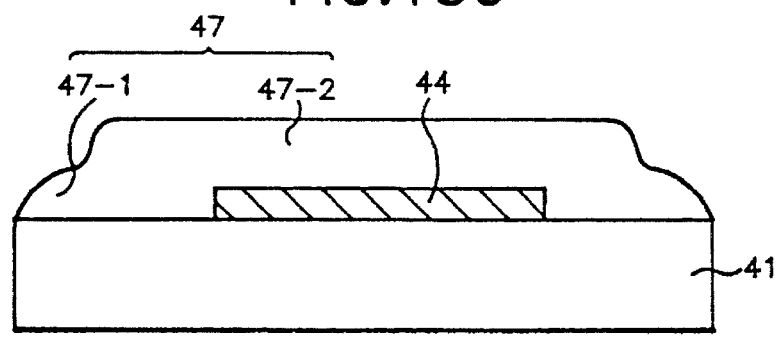

FIG. 13(a) is a plan view of a phase shifting mask in accordance with a third embodiment of this invention, FIG. 13(b) is a section across line C—C' of FIG. 13(a), and FIG. 13(c) is a section across line D—D' of FIG. 13(a).

Referring to FIGS. 13(a) to 13(c) for the phase shifting mask in accordance with the third embodiment, though the 90 degrees area 47-2 is formed only at the edge part in the longitudinal direction of the phase shifter 47 in accordance with the first embodiment, the 90 degrees area 47-2 is formed at all edges of the phase shifters in accordance with the third embodiment.

FIGS. 14(a) to 14(i) show a process for fabricating a phase shifting mask across line C—C' of FIG. 13(a), and FIGS. 15(a) to 15(i) show a process for fabricating a phase shifting mask across line D—D' of FIG. 13(a).

Referring to FIGS. 14(a) to 14(i) and 15(a) to 15(i), the process for fabricating a phase shifting mask in accordance with the third embodiment has, same as the first embodiment, a plurality of opaque layer patterns 44 formed on a substrate 41, and an election beam resist film 45 coated on all over the substrate the opaque layer patterns 44 have been formed thereon (FIGS. 14(a) to 14(d) and 15(a) to 15(d)).

Figure 14A:
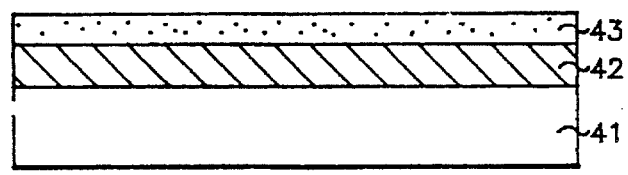
FIGS. 14(a) to 14(i) show a process for fabrication across line C—C' of FIG. 13(a).
Figure 14B:
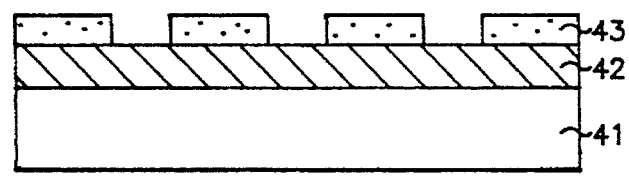
Figure 14C:
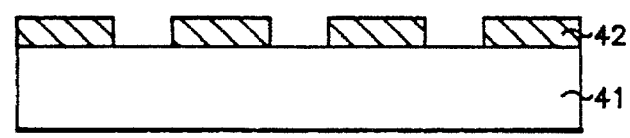
Figure 14D:
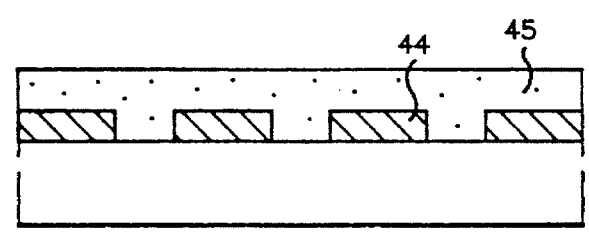
Figure 14E:
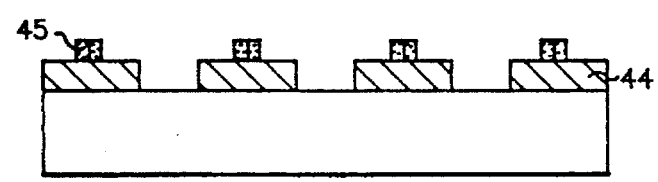
Figure 14F:
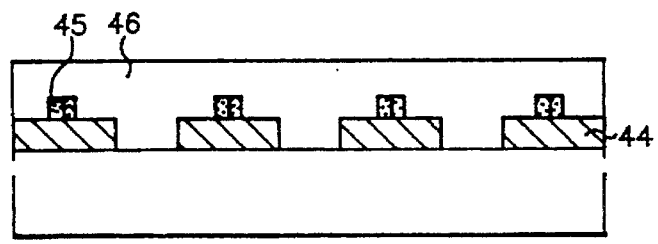
Figure 14G:
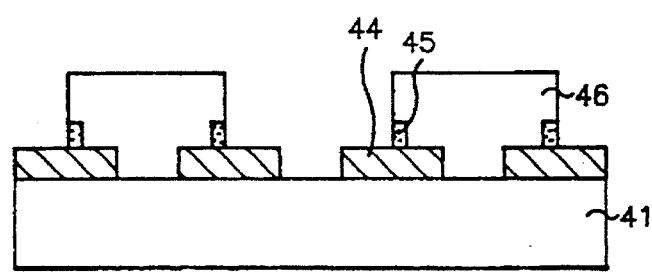
Figure 15A:
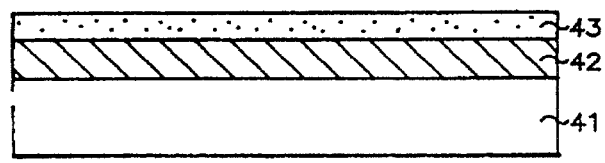
FIGS. 15(a) to 15(i) show a process for fabrication across line D—D' of FIG. 13(a).
Figure 15B:
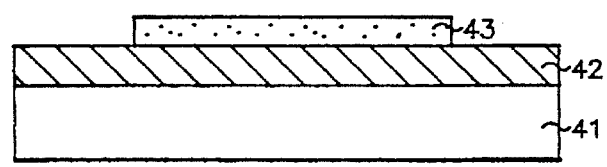
Figure 15C:
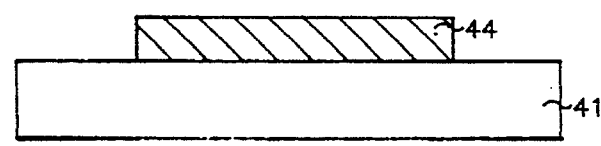
Figure 15D:
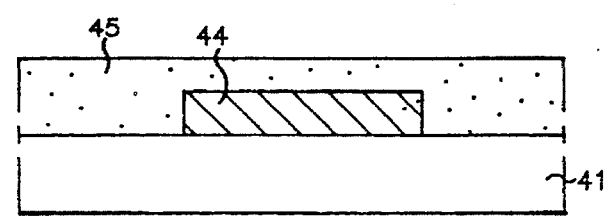
Figure 15E:
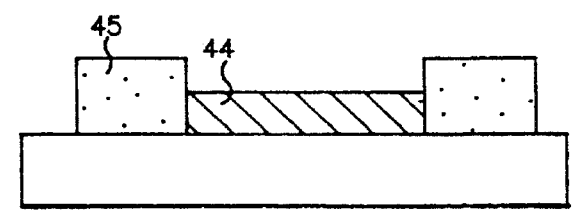
Figure 15F:
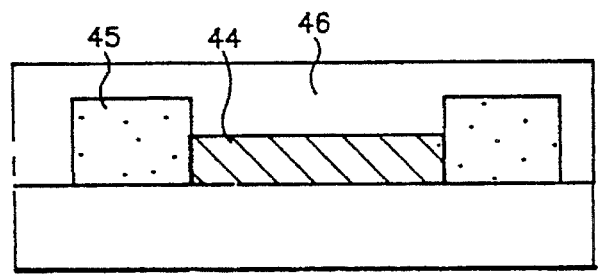
Figure 15G:
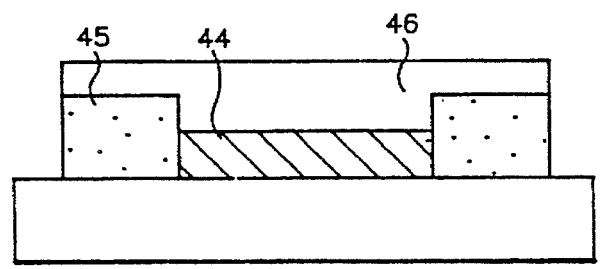

Then, as shown in FIGS. 14(e) and 15(e), the electron beam resist film 44 is undertaken patterning using an electron beam lithography system.

As shown in FIGS. 15(f) to 15(g) and 16(f) to 16(g), a SOG film 46 is coated on all over the substrate the resist film 45 and the opaque layer patterns 44 have been formed thereon, and is undertaken patterning.

Figure 16C:
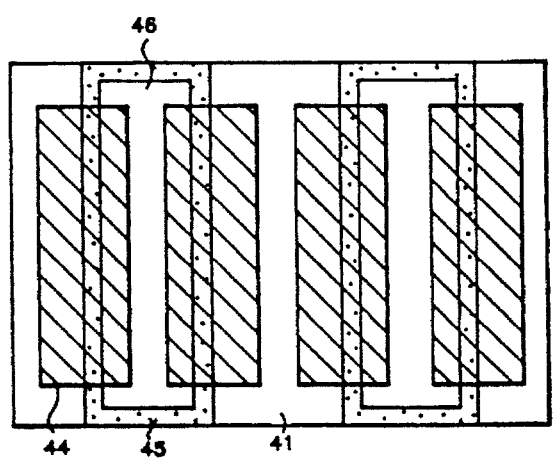

Referring to FIG. 16(c), in the third embodiment, the pattern of the electron beam resist film 45 is formed at lower part of all the edges of the SOG film 46.

Figure 14H:
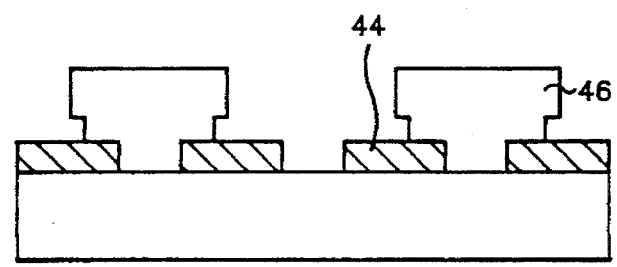
Figure 14I:
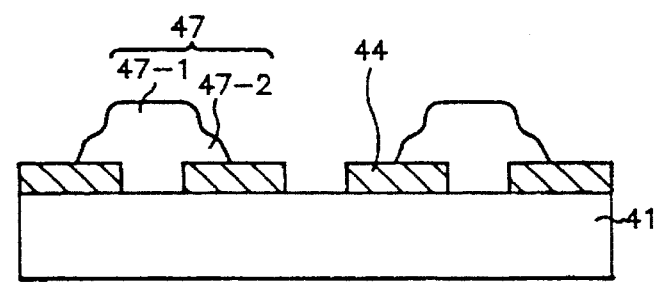
Figure 15H:
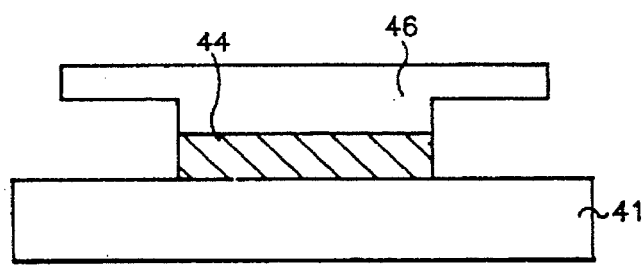
Figure 15I:
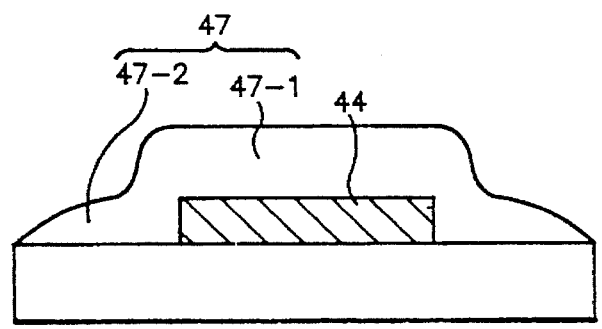

Next, the electron beam resist film 45 formed at lower part of the SOG film 46 is removed totally (FIGS. 14(h) and 15(h)), and a phase shifter 47 is formed over one pair of the adjacent opaque layer patterns 44 (FIGS. 14(i) and 15(i)).

Referring to FIGS. 14(i) and 15(i), center of the phase shifter 47 is a 180 degrees area 47-1 and all the edges thereof are a 90 degrees area 47-2.

As the foregoing description, this invention has following advantages over the conventional method for fabricating a phase shifting mask.

First, there is easiness in process because forming of the 90 degrees area is carried out with heat treatment in this invention, while there is difficulty in obtaining exact 90 degrees area because a phase shifter having 90 degrees area is formed by etching both edges of a phase shifter in conventional method.

And, as the heat treatment is carried out at a temperature range of 200 to 400 degrees C., a low temperature heat treatment is viable.

Second, because this invention can control the thickness of a photoresist film to form an exact 90 degrees phase shifter easily, it is possible to prevent a phase shifter from forming bridge pattern films generated at the side walls thereon.

Third, in case this phase shifting mask is to be used in a positive photoresist process, it is possible to obtain a good quality pattern profile.

What is claimed is:

1. A method for fabricating a phase shifting mask comprising steps for:

forming a plurality of opaque layer patterns in array at a fixed interval from each other in the direction of width thereof on a substrate;

coating an interlayer on all over the substrate to cover the plurality of the opaque layer patterns;

forming interlayer .patterns on the substrate at both sides in the longitudinal direction of each opaque layer pattern by etching the interlayers;

forming a plurality of insulation films on the substrate between adjacent one pair of the opaque layer patterns the interlayer patterns formed thereon;

removing the remained interlayers under each of the insulation film; and forming a phase shifter having 90 degrees area in a part where the interlayer has been removed and 180 degrees area in rest of the part by making the insulation film cause to flow with heat treatment.

2. The method as claimed in claim 1, wherein quartz is used for the substrate.

3. The method as claimed in claim 1, wherein the step for forming a plurality of opaque layer patterns includes steps for:

coating an opaque layer on the substrate;

coating a resist film on the opaque layer;

forming photoresist film patterns in array on a line with a fixed interval from each other, and exposing the opaque layer by etching the resist film;

etching the exposed opaque layer using the resist film pattern as a mask; and forming opaque layer patterns by removing the resist film patterns.

4. The method as claimed in claim 3, wherein a chrome layer is used for the opaque layer.

5. The method as claimed in claim 3, wherein an electron beam resist film is used for the resist film.

6. The method as claimed in claim 3, wherein an electron beam lithography system is employed at the time of etching of the resist film.

7. The method as claimed in claim 1, wherein a spin on glass film is used for the phase shifting insulation film.

8. The method as claimed in claim 1, wherein thickness d of the phase shifter can be represented by following formulae;

$$d=\lambda/2(n-1),$$

where n is refraction index of the phase shifter, λ is wave length of light and d is thickness of the phase shifter.

9. The method as claimed in claim 1, wherein thickness of the interlayer is one half of the thickness of the phase shifter.

10. The method as claimed in claim 1, wherein an electron beam resist film is used for the interlayer.

11. The method as claimed in claim 1, wherein the heat treatment is carried out at a temperature range of 200 to 400 degrees C.

12. A method for fabricating a phase shifting mask comprising steps for:

forming a plurality of opaque layer patterns in array at a fixed interval in the direction of width thereof on a substrate;

coating an interlayer on all over the substrate to cover the plurality of the opaque layer patterns;

forming interlayer patterns beyond sides of one pair of adjacent opaque layer patterns facing each other in the longitudinal direction of each opaque layer pattern on the substrate by etching the interlayers;

forming a plurality of insulation films on the substrate between adjacent one pair of the opaque layer patterns the interlayer patterns formed thereon;

removing the remained interlayers under each of the insulation film; and forming a phase shifter having 90 degrees area in a part where the interlayer has been removed and 180 degrees area in rest of the part by making the insulation film cause to flow with heat treatment.

13. The method as claimed in claim 12, wherein quartz is used for the substrate.

14. The method as claimed in claim 13, wherein the heat treatment is carried out at a temperature range of 200 to 400 degrees C.

15. The method as claimed in claim 12, wherein the step for forming a plurality of opaque layer patterns includes steps for:

coating an opaque layer on the substrate;

coating a resist film on the opaque layer;

forming photoresist film patterns in a direction of width with a fixed interval from each other, and exposing the opaque layer by etching the resist film;

etching the exposed opaque layer using the resist film pattern as a mask; and forming opaque layer patterns by removing the resist film patterns.

16. The method as claimed in claim 15, wherein a chrome layer is used for the opaque layer.

17. The method as claimed in claim 15, wherein an electron beam resist film is used for the resist film.

18. The method as claimed in claim 15, wherein an electron beam lithography system is employed at the time of etching of the resist film.

19. The method as claimed in claim 12, wherein a spin on glass film is used for the phase shifting insulation film.

20. The method as claimed in claim 12, wherein thickness d of the phase shifter can be represented by following formulae;

$$d=\lambda/2(n-1),$$

where n is refraction index of the phase shifter, λ is wave length of light and d is thickness of the phase shifter.

21. The method as claimed in claim 12, wherein thickness of the interlayer is half of the thickness of the phase shifter.

22. The method as claimed in claim 12, wherein an electron beam resist film is used for the interlayer.

23. A method for fabricating a phase shifting mask comprising steps for:

forming a plurality of opaque layer patterns in array at a fixed interval from each other in the direction of width thereof on a substrate;

coating an interlayer on all over the substrate to cover the plurality of the opaque layer patterns;

forming interlayer patterns on the substrate spaced in a certain distance from both sides of each opaque layer pattern in the longitudinal direction thereof and excluding each layer pattern in the direction of width thereof by etching the interlayers;

forming a plurality of insulation films on the substrate between adjacent one pair of the opaque layer patterns the interlayer patterns formed thereon;

removing the remained interlayers under each of the insulation film; and forming a phase shifter having 90 degrees area in a part where the interlayer has been removed and 180 degrees area in rest of the part by making the insulation film cause to flow with heat treatment.

24. The method as claimed in claim 23, wherein quartz is used for the substrate.

25. The method as claimed in claim 23, wherein the step for forming a plurality of opaque layer patterns includes steps for:

coating an opaque layer on the substrate;

coating a resist film on the opaque layer;

forming photoresist film patterns in array on a line with a fixed interval from each other, and exposing the opaque layer by etching the resist film;

etching the exposed opaque layer using the resist film pattern as a mask; and forming opaque layer patterns by removing the resist film patterns.

26. The method as claimed in claim 25, wherein a chrome layer is used for the opaque layer.

27. The method as claimed in claim 25, wherein an electron beam resist film is used for the resist film.

28. The method as claimed in claim 25, wherein an electron beam lithography system is employed at the time of etching of the resist film.

29. The method as claimed in claim 23, wherein a spin on glass film is used for the phase shifting insulation film.

30. The method as claimed in claim 23, wherein thickness d of the phase shifter can be represented by following formulae;

$$d=\lambda/2(n-1),$$

where n is refraction index of the phase shifter, λ is wave length of light and d is thickness of the phase shifter.

31. The method as claimed in claim 23, wherein thickness of the interlayer is one half of the thickness of the phase shifter.

32. The method as claimed in claim 23, wherein an electron beam resist film is used for the interlayer.

33. The method as claimed in claim 23, wherein the heat treatment is carried out at a temperature range of 200 to 400 degrees C.

34. A method for fabricating a phase shifting mask comprising steps for:

forming a plurality of opaque layer patterns in array at a fixed interval from each other in the direction of width thereof on a substrate;

coating an interlayer on all over the substrate to cover the plurality of the opaque layer patterns;

forming interlayer patterns on the substrate spaced in a certain distance from both sides of each opaque layer pattern in the longitudinal direction thereof and on the center of each opaque layer in the direction of width of the opaque layer pattern by etching the interlayers;

forming a plurality of insulation films on the substrate between adjacent one pair of the opaque layer patterns the interlayer patterns formed thereon;

removing the remained interlayers under each of the insulation film; and forming a phase shifter having 90 degrees area in a part where the interlayer has been removed and 180 degrees area in rest of the part by making the insulation film cause to flow with heat treatment.

35. The method as claimed in claim 34, wherein quartz is used for the substrate.

36. The method as claimed in claim 34, wherein the step for forming a plurality of opaque layer patterns includes steps for:

coating an opaque layer on the substrate;

coating a resist film on the opaque layer;

forming photoresist film patterns in array on a line with a fixed interval from each other, and exposing the opaque layer by etching the resist film;

etching the exposed opaque layer using the resist film pattern as a mask; and forming opaque layer patterns by removing the resist film patterns.

37. The method as claimed in claim 36, wherein a chrome layer is used for the opaque layer.

38. The method as claimed in claim 36, wherein an electron beam resist film is used for the resist film.

39. The method as claimed in claim 36, wherein an electron beam lithography system is employed at the time of etching of the resist film.

40. The method as claimed in claim 34, wherein a spin on glass film is used for the phase shifting insulation film.

41. The method as claimed in claim 34, wherein thickness d of the phase shifter can be represented by following formulae;

$$d=\lambda/2(n-1),$$

where n is refraction index of the phase shifter, $\lambda$ is wave length of light and d is thickness of the phase shifter.

42. The method as claimed in claim 34, wherein thickness of the interlayer is half of the thickness of the phase shifter.

43. The method as claimed in claim 34, wherein an electron beam resist film is used for the interlayer.

44. The method as claimed in claim 34, wherein the heat treatment is carried out at a temperature range of 200 to 400 degrees C.

45. A method for fabricating a phase shifting mask, comprising the steps of:

(a) forming a plurality of opaque layer patterns in an array at a fixed interval from each other in their width direction on a substrate;

(b) coating an interlayer on and covering the opaque layer patterns;

(c) forming interlayer patterns on the substrate at both longitudinal sides of each opaque layer pattern by etching the interlayer;

(d) forming a plurality of insulation films on the substrate between adjacent pairs of the opaque layer patterns on which the interlayer patterns are formed;

(e) removing the remaining interlayer under each of the insulation films; and (f) forming a phase shifter having a ninety degree area in a region where the interlayer has been removed and a one hundred and eighty degree area in the remainder of the region by heating the insulation film.

* * * * *